United States Patent [19]

Ohshima et al.

[11] Patent Number: 4,644,552
[45] Date of Patent: Feb. 17, 1987

[54] SEMICONDUCTOR LASER

[75] Inventors: Masaaki Ohshima, Yokohama; Michio Matsuki, Kanagawa, both of Japan

[73] Assignee: Matsushita Electric Industrial Co., Ltd., Osaka, Japan

[21] Appl. No.: 612,642

[22] Filed: May 21, 1984

[30] Foreign Application Priority Data

May 24, 1983 [JP] Japan .................................. 58-91828

[51] Int. Cl.[4] ............................................. H01S 3/19
[52] U.S. Cl. ........................................ 372/45; 357/17; 372/46
[58] Field of Search ...................... 372/44, 45, 46, 48; 357/17

[56] References Cited

U.S. PATENT DOCUMENTS 4,251,298  2/1981  Thompson ........................... 372/48

Primary Examiner—James W. Davie
Attorney, Agent, or Firm—Spencer & Frank

[57] ABSTRACT

A semiconductive laser comprises an active layer made in the shape of a crescent moon with the distribution of refractive index approximated by a quadratic curve. InGaAsP layers with a refractive index smaller than that of the active layer are disposed on both sides of the active layer.

6 Claims, 6 Drawing Figures

FIG. 1 PRIOR ART
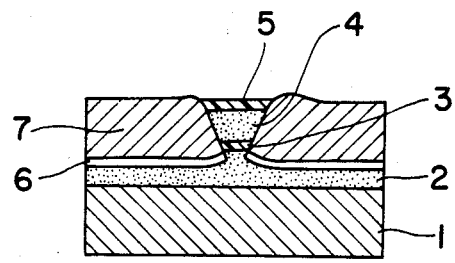
FIG. 3a
PRIOR ART
FIG. 3b
THIS INVENTION
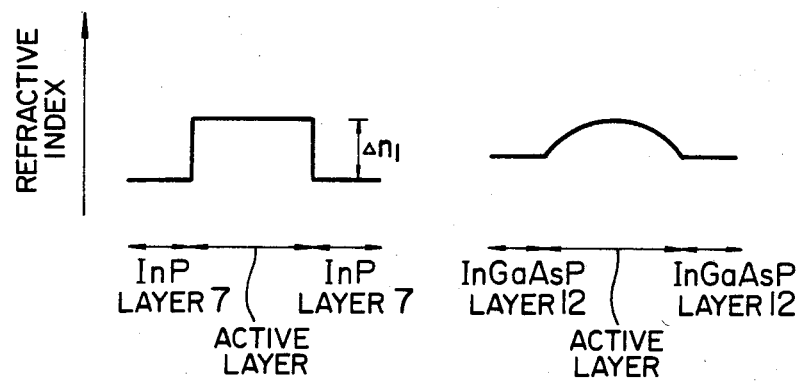

4,644,552

SEMICONDUCTOR LASER

BACKGROUND OF THE INVENTION

Semiconductor lasers are now almost in the stage of practical use as light sources for optical communication. Especially, in the neighborhood of a wavelength of 1.3 μm, fibers of the silica system have an extremely low loss. This has led to active development of InGaAsP-/InP semiconductor lasers capable of obtaining laser light with the above wavelength. Use of single mode fibers is particularly useful for communication in the band of this wavelength.

The light source for the single mode fiber requires the following characteristics:

(1) transverse single mode and spot-like oscillation,
(2) small beam divergence,
(3) small operating current, etc.

The conventional, especially primitive, lasers of the stripe type are liable to cause multimode oscillation as the operation current is increased. Furthermore, the operation current is extremely large. In order to attain a low threshold current and mode stability, a buried-type laser has been proposed. As shown in FIG. 1, an n-InP layer 2, an n-InGaAsP active layer 3, a p-InP layer 4 and a p-InGaAsP cap layer 5 are successively grown on an n-InP substrate 1 by the first liquid phase epitaxial growth. These layers are processed by etching in an inverted mesa shape. Thereafter, a current block layer composed of a p-InP layer 6 and an n-InP layer 7 is grown. In such a structure, since the width of the active layer is about 2 μm and the whole region surrounding the layer is made of InP with a small refractive index, light and current are confined efficiently. Thus, transverse single mode oscillation is obtained at a low threshold current.

However, a difficulty in manufacturing the above structure is that unless the width of the active layer formed by etching after the first epitaxial growth is of the order of 2 μm, no transverse single mode oscillation can be obtained.

In the present stage, wet-etching has been the only method for obtaining such a narrow etching. However, this method has poor controllability. Namely, only a slightly fast progress of etching causes breaking of the active layer. On the other hand, if the width of the active layer is made too large, no transverse single mode oscillation is obtained although the active layer is not easily broken. The most critical problem of the conventional method is that unless the width of active layer is equal to or less than 3 μm, when its thickness is assumed to be about 0.2 μm, no transverse single mode is realized. As described above, the fact that the laser oscillates in the single mode is the essential condition for making the best use of the advantage of the single mode fiber. Therefore, the controllability of etching may be considered to be the most important problem of the lasers of the above-mentioned type.

This invention relates to a semiconductor laser which is used as a light emitting element in the field of optical communication and related fields.

SUMMARY OF THE INVENTION

The objective of this invention is to relax the allowance for the narrowness of the active layer which has been difficult to control for obtaining the transverse single mode, thereby to obtain a semiconductor laser that can operate stably in the transverse single mode at a low threshold current.

According to this invention, the active layer is made to have the shape of a crescent moon so that the distribution of the refractive index may be approximated by a quadratic curve. On both sides of this active layer, InGaAsP layers with a smaller refractive index than that of the active layer are disposed. The shape of the active layer and the disposition of the light confinement layers make the fundamental mode of oscillation readily generated in the center region. Due to a large loss on both sides a, transverse single mode can be obtained even if the active layer is wide.

BRIEF DESCRIPTION OF THE DRAWINGS

FIG. 1 shows a cross-sectional view of a semiconductor laser according to one embodiment of the prior art.

FIGS. 3a and 3b are diagrams showing the distributions of refractive indexes of the active layers according to the buried-type and the embodiment of this invention, respectively.

DESCRIPTION OF THE PREFERRED EMBODIMENT

This invention will be explained hereinafter with reference to embodiments.

EMBODIMENTS 1

Figure 2A:
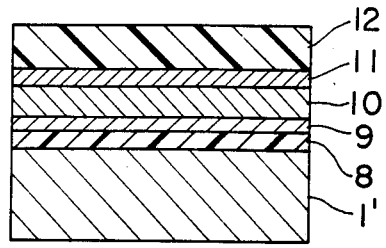
FIGS. 2a, 2b and 2c are diagrams showing a process for manufacturing a semiconductor laser according to one embodiment of this invention.
Figure 2B:
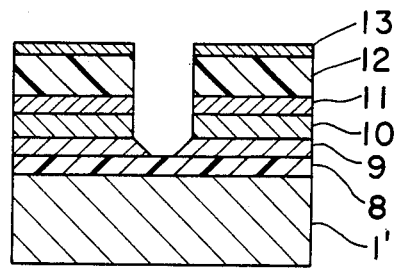

FIG. 2 shows cross-sections of the liquid phase epitaxial growth layers in the steps of manufacturing a semiconductor laser. As shown in FIG. 2a, an n-InGaAsP layer (with a composition corresponding to a wavelength of 1.3 μm; hereinafter referred to as a $Q_1$ layer) 8, a p-InP layer 9, an n-InP layer 10, a p-InP layer 11 and an n-InGaAsP layer 12 (with a composition corresponding to a wavelength of 1.0 μm; hereinafter referred to as a $Q_2$ layer) were grown successively on an n-InP substrate 1'. Next, as shown in FIG. 2b, after an $SiO_2$ film 13 was formed, the film was removed in the shape of a stripe with a width of about 2 μm by using the photo-lithographic method. Then, the $Q_2$ layer 12 was removed by an etchant composed of $H_2SO_4:H_2O_2:H_2O=3:1:1$, and InP layers 9, 10 and 11 were etched by HCl. Since HCl caused no erosion of both the $Q_2$ layer 12 and the $Q_1$ layer 8, etching stopped at the $Q_1$ layer 8. This $Q_1$ layer is not essential for the invention and could be omitted.

Figure 2C:
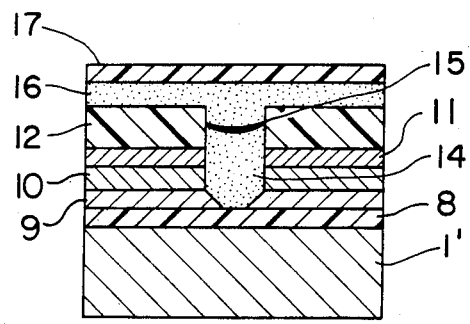

On the substrate in which a groove is formed by etching, an n-Inp layer 14, an n-InGaAsP layer 15 (with a composition corresponding to a wavelength of 1.3 μm; hereinafter referred to as a $Q_3$ layer), a p-InP layer 16, and a p-InGaAsP layer 17 (with a composition corresponding to a wavelength of 1.05 μm; hereinafter referred to as a $Q_4$ layer) were successively grown. The $Q_3$ layer 15, which was an active layer, had a shape of a crescent moon, as shown in FIG. 2c, and a thickness of 0.2 μm at the center. The $Q_3$ layer was grown such that it was positioned in the neighborhood of the center of $Q_2$ layer 12. The $Q_4$ layer 17, which was a top layer, became a cap for the electrode.

Ohmic electrodes were formed on the wafer with the above structure of accumulated layers by Au/Zn-Au on the $Q_4$ layer 17 and Au/Sn-Au on the side of n-InP substrate 1'. A laser chip with a cavity length of about 300 μm was cut out by cleavage. The average threshold current of the chip was about 20 mA. Measurement of the transverse mode with a width of the active layer of 2 μm showed that at 25° C. single mode oscillation was obtained up to 60 mW. From the measurement of far field image, beam divergence in the direction perpendicular to the juncture surface (hereinafter referred to as $\theta_\perp$) was about 32° while that in the direction parallel to the junction surface (hereinafter referred to as $\theta_\parallel$) was about 20°.

EMBODIMENT 2

The structure and manufacturing method were kept the same as in embodiment 1. The thickness of the center part of the active layer was fixed at 0.2 μm. The width of the active layer was varied in five ways; 3 μm, 3.5 μm, 4 μm, 5 μm and 6 μm, and the transverse mode was examined. Up to a width of 5 μm, transverse single mode oscillation was obtained even with an oscillation output of 30 mW. In contrast with a width which should be etched to about 3 μm in the case of the conventional buried type structure, a groove with a width of 5 μm can be etched with good controllability and high accuracy. The average threshold current for the case of a width of 5 μm was 45 mA.

EMBODIMENT 3

The active layer in embodiment 2 was moved to the position of the n-InP layer 11. After a similar experiment, in which the active layer was sandwiched by the n-InP layer 11, it was found that higher harmonic modes were observed when the width was equal to or larger than 3.5 μm.

EMBODIMENT 4

In the structure as shown in FIG. 2c, the width of the active layer and the thickness of the center region were fixed at 4 μm and 0.2 μm, respectively. The composition of the $Q_2$ layers on both sides of the active layer was varied, and variations of the transverse mode and threshold current were measured. Variations of the band gap due to the change of composition of the $Q_2$ layer were 0.94 μm, 0.96 μm, 1.05 μm, 1.18 μm and 1.2 μm in the unit of wavelength. It was found that between the band gaps of 0.96 μm and 1.18 μm transverse single mode operation was obtained and the average threshold current was 30 mA. With the band gap of 0.94 μm, although higher harmonic modes were observed, no change in the threshold current was seen. With the band gap of 1.2 μm, although transverse single mode operation was obtained, the average threshold current increased to 60 mA. This is considered to be due to the leakage of light because the refractive indexes of the $Q_2$ layers on both sides and the active layer became small. It should be noted that all the measurements were made with the oscillation output of light of a transverse single mode fixed at 30 mW.

Therefore, when the width of the active layer was made less than or equal to 4 μm with the thickness held at 0.2 μm, the composition of the $Q_2$ layers on both sides which ensured operation in a transverse single mode without increase in the threshold current was within a range between 0.96 μm and 1.18 μm in the unit of wavelength.

EMBODIMENT 5

The same structure as in embodiment 1 was used. The substrate was p-InP. Except in the active layer, the conductivity types of the grown layers were inverted; namely, p-type layer to n-type layer and n-type layer to p-type layer. As a result, the average threshold current became 25 mA. With the width of the active layer of 4 μm and the maximum active layer thickness of 0.2 μm, transverse single mode oscillation was obtained under the operating condition of a layer oscillation power output of 30 mW. This means that the idea of this invention may also be applied effectively to the use of a p-type InP substrate.

EMBODIMENT 6

The same structure and manufacturing process as in embodiment 1 were used. p-InP layer 9, n-InP layer 10 and p-InP layer 11 which constituted a current block layer were substituted by InGaAsP layers (corresponding to the n-InGaAsP layer 12 in embodiment 1) under the condition of the same composition. Namely, p-InP layer 9 and n-InP layer 10 were substituted by p-InGaAsP and n-InGaAsP layers, respectively.

As apparent from the above-mentioned embodiments, according to this invention, even if the width of the active layer is not very small, a stable transverse single mode can be obtained. The reason is as follows: on both sides of the active layer, InGaAsP layers with a refractive index larger than that of InP but smaller than that of the active layer are sandwiched; and the distribution of refractive index of the active layer is made to follow approximately a quadratic curve. The variation of refractive index near the active layer is as shown in FIGS. 3a and 3b, wherein FIG. 3a shows that of the prior art while FIG. 3b shows that of the invention. It is seen from FIG. 3a that, in the prior art, the refractive index varies like a step function from the buried layer to the active layer with a large step of $\Delta n_1$. Furthermore, the active layer has a uniform refractive index. On the other hand, it can be easily understood from FIG. 3b that, according to this invention, a fundamental mode of oscillation is made to build up readily in the center region of the active layer and that higher harmonic modes generated outside this center region are effectively attenuated. This makes a stable oscillation even with a large active layer width.

Furthermore, according to the embodiments of this invention, through the provision of a current blocking layer composed of n-InP layers 9 and 11 and p-InP layer, a laser with a very low threshold current is obtainable.

As described above, the semiconductor laser of this invention can relax the allowance of narrowness of the active layer, which has been extremely difficult in controlling transverse modes. Thus, the laser can have a stable transverse single mode at a low threshold current. Furthermore, problems in the manufacture of semiconductor lasers in the prior art are solved. Therefore, an improvement in the yield of semiconductor laser is expected.

We claim:

1. In a semiconductor laser, the combination comprising
    a substrate;
    a current blocking layer deposited on said substrate;
    a first InGaAsP layer deposited on said current blocking layer, said current blocking and first InGaAsP layers having a groove therein, the current blocking and first InGaAsP layers constituting side walls of said groove;
    a first InP layer deposited in said groove;

a second InGaAsP active layer formed in said groove on said first InP layer opposite said first InGaAsP layer, said second InGaAsP layer having a peripheral portion which is thinner than the center region thereof, the refractive index of said first InGaAsP layer being less than that of said second InGaAsP layer; and a second InP layer formed on said first and second InGaAsP layers.

2. The combination according to claim 1, wherein said first InGaAsP layer has a band gap of 0.96 to 1.18 μm in the unit of wavelength.

3. The combination according to claim 1, wherein said current blocking layer is composed of sequential layers including an InP layer of one conductivity type, an InP layer of the other conductivity type and an InP layer of said one conductivity type.

4. The combination according to claim 2, wherein the wavelength of said second InGaAsP layer has a band gap of 1.3 μm.

5. In a semiconductor laser, the combination comprising an InP substrate having one conductivity type;

an accumulation layer deposited on said substrate, said accumulation layer being composed of sequential layers including a first InGaAsP layer of said one conductivity type;

a first InP layer of the other conductivity type;

a second InP layer of said one conductivity type;

a third InP layer of said other conductivity type; and a second InGaASP layer of said one conductivity type, said first, second and third InP layers and said second InGaASP layer having a groove therein, the first, second and third InP layers and said second InGaAsP layer forming the side walls of said groove;

a fourth InP layer of said one conductivity type deposited in said groove;

a third InGaAsP layer formed in said groove on said fourth InP layer opposite said second InGaAsP layer, said third InGaAsP active layer having the shape of a crescent moon and being of said one conductivity type;

a fifth InP layer of said other conductivity type formed on said second and third InGaAsP layers; and a fourth InGaAsP layer of said other conductivity type deposited on said fifth InP layer.

6. The combination according to claim 5, wherein the band gap of said first InGaAsP layer is 1.3 μm in the unit of wavelength while that of said second InGaAsP layer is 0.96 μm to 1.18 μm in the unit of wavelength.

* * * * *